(12) United States Patent
Kim et al.

(10) Patent No.: US 9,349,731 B2
(45) Date of Patent: May 24, 2016

(54) METHOD FOR MANUFACTURING A SEMICONDUCTOR DEVICE

(71) Applicant: SAMSUNG ELECTRONICS CO., LTD., Suwon-si, Gyeonggi-do (KR)

(72) Inventors: Ju-Youn Kim, Gyeonggi-do (KR); Je-Don Kim, Seoul (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 230 days.

(21) Appl. No.: 13/647,577

(22) Filed: Oct. 9, 2012

(65) Prior Publication Data

US 2014/0099784 A1 Apr. 10, 2014

(51) Int. Cl.

| H01L 21/3205 | (2006.01) |
|---|---|
| H01L 27/092 | (2006.01) |
| H01L 21/28 | (2006.01) |
| H01L 29/66 | (2006.01) |
| H01L 21/8238 | (2006.01) |
| H01L 29/06 | (2006.01) |
| H01L 29/423 | (2006.01) |
| H01L 29/45 | (2006.01) |
| H01L 29/49 | (2006.01) |

(Continued)

(52) U.S. Cl.
CPC ........ *H01L 27/092* (2013.01); *H01L 21/28088* (2013.01); *H01L 21/28247* (2013.01); *H01L 21/76801* (2013.01); *H01L 21/76829* (2013.01); *H01L 21/823807* (2013.01); *H01L 21/823842* (2013.01); *H01L 21/823871* (2013.01); *H01L 29/0642* (2013.01); *H01L 29/42364* (2013.01); *H01L 29/42376* (2013.01); *H01L 29/45* (2013.01); *H01L 29/4966* (2013.01); *H01L 29/511* (2013.01); *H01L 29/66545* (2013.01); *H01L 21/02068* (2013.01); *H01L 21/32134* (2013.01); *H01L 21/32135* (2013.01); *H01L 21/76897* (2013.01); *H01L 29/517* (2013.01); *H01L 29/6656* (2013.01)

(58) Field of Classification Search
CPC .................................................. H01L 29/66545
USPC .................. 438/587, 588, 589; 257/E21.209, 257/E21.159
See application file for complete search history.

(56) References Cited

U.S. PATENT DOCUMENTS

| 6,720,269 B2 | 4/2004 | Park et al. |
|---|---|---|
| 7,018,873 B2 | 3/2006 | Dennard et al. |

(Continued)

FOREIGN PATENT DOCUMENTS

| JP | 11-087657 | 3/1999 |
|---|---|---|
| JP | 2001-144269 | 5/2001 |

(Continued)

*Primary Examiner* — Julia Slutsker
(74) *Attorney, Agent, or Firm* — F. Chau & Associates, LLC

(57) ABSTRACT

A method for manufacturing a semiconductor device includes forming an insulation film including a trench on a substrate, forming a first metal gate film pattern and a second metal gate film pattern in the trench, redepositing a second metal gate film on the first and second metal gate film patterns and the insulation film, and forming a redeposited second metal gate film pattern on the first and second metal gate film patterns by performing a planarization process for removing a portion of the redeposited second metal gate film so as to expose a top surface of the insulation film, and forming a blocking layer pattern on the redeposited second metal gate film pattern by oxidizing an exposed surface of the redeposited second metal gate film pattern.

17 Claims, 11 Drawing Sheets

(51) Int. Cl.
*H01L 21/768* (2006.01)
*H01L 29/51* (2006.01)
*H01L 21/02* (2006.01)
*H01L 21/3213* (2006.01)

(56) References Cited

U.S. PATENT DOCUMENTS

2002/0096700 A1  7/2002  Inoue
2004/0175910 A1* 9/2004  Pan et al. .................... 438/592
2006/0278934 A1* 12/2006 Nagahama ................. 257/369
2010/0314687 A1* 12/2010 Xu ............................. 257/369
2012/0139061 A1*  6/2012 Ramachandran et al. .... 257/410
2013/0040450 A1*  2/2013 Xie et al. ..................... 438/593
2013/0099307 A1*  4/2013 Tseng ............... H01L 21/28088
                                                    257/330

FOREIGN PATENT DOCUMENTS

| JP | 2001-267561 | 9/2001 |
| JP | 2005-236120 | 9/2005 |
| KR | 1020020002070 | 1/2002 |
| KR | 1020020003027 | 1/2002 |
| KR | 1020020003624 | 1/2002 |
| KR | 1020020029531 | 4/2002 |

* cited by examiner

METHOD FOR MANUFACTURING A SEMICONDUCTOR DEVICE

TECHNICAL FIELD

The present disclosure relates to a method for manufacturing a semiconductor device.

DISCUSSION OF THE RELATED ART

A semiconductor device, such as, for example, a transistor, a resistor or a capacitor, includes one or more contacts that can be connected thereto. However, as the integration level of a circuit increases, there is a possibility that a metal gate and a contact are vulnerable to an electric short. In addition, a passivation film (e.g., a nitride film) formed on the metal gate may be removed during a manufacturing process, and a contact, such as a self-aligned contact (SAC) is formed of a metal. As a result, the metal gate and the contact may be electrically shorted.

As described above, as the metal gate and the contact may be electrically shorted, a short circuit may be formed in the semiconductor device. The short circuit may lower the performance (e.g., the yield) of semiconductor device.

To prevent a short between the metal gate and the contact, some films of the metal gate may be used as blocking layers. However, even if a blocking layer is formed on a metal gate, a portion of the metal gate used as a conductive layer may be still exposed to a risk of electric short. For example, while a central portion of the metal gate can be protected by the blocking layer, an edge portion of the metal gate may not be protected by the blocking layer. In this case, the metal gate and the contact may be electrically shorted.

Accordingly, there is a need in the art for a method for manufacturing a semiconductor device, which can effectively prevent an electric short from occurring between a wiring such as SAC and a metal gate. In addition, there is a need in the art for a method for manufacturing a semiconductor device, which can be compatible with a replacement metal gate (RMG) process that can reduce gate resistance while effectively preventing an electric short.

SUMMARY

Exemplary embodiments of the present invention provide a method for manufacturing a semiconductor device, which can prevent a short between a metal gate and a contact by forming a blocking layer that can entirely protect a top surface of the metal gate.

According to an exemplary embodiment of the present invention, there is provided a method for manufacturing semiconductor device. The method includes forming an insulation film including a trench on a substrate, forming a first metal gate film pattern and a second metal gate film pattern in the trench, redepositing a second metal gate film on the first and second metal gate film patterns and the insulation film, and forming a redeposited second metal gate film pattern on the first and second metal gate film patterns by performing a planarization process for removing a portion of the redeposited second metal gate film so as to expose a top surface of the insulation film, and forming a blocking layer pattern on the redeposited second metal gate film pattern by oxidizing an exposed surface of the redeposited second metal gate film pattern.

For example, in an exemplary embodiment, a height ranging from the substrate to a top surface of the insulation film may be greater than a height ranging from the substrate to a top surface of each of the first and second gate metal film patterns.

According to an exemplary embodiment of the present invention, there is provided a method for manufacturing semiconductor device. The method includes forming an insulation film including a trench on a substrate, depositing a first metal gate film conformally along a top surface of the insulation film and on a side surface and a bottom surface of the trench, depositing a second metal gate film on the first metal gate film, forming first and second metal gate film patterns by performing a first planarization process for removing portions of the first and second metal gate films so as to expose a top surface of the insulation film, performing a metal gate pull back process to etch upper portions of the first and second metal gate film patterns to a predetermined depth, and redepositing a second metal gate film on the partially etched first and second metal gate film patterns and the insulation film. The method further includes forming a redeposited second metal gate film pattern on the partially etched first and second metal gate film patterns by performing a second planarization process for removing a portion of the redeposited second metal gate film so as to expose the top surface of the insulation film, and forming a blocking layer pattern covering an exposed surface of the redeposited second metal gate film pattern.

In accordance with an exemplary embodiment of the present invention, a method for manufacturing a semiconductor device is provided. The method includes forming a first insulation film on a substrate which includes a first region and a second region, forming a first dummy gate film pattern in the first insulation film in the first region and a second dummy gate film pattern in the first insulation film in the second region, removing the first dummy gate film pattern from the first region and the second dummy gate film pattern from the second region to thereby form a first trench in the first insulation film on the first region of the substrate and a second trench in the first insulation film on the second region of the substrate, sequentially depositing a first high dielectric constant (high k) film and a first metal gate film along a top surface of the first insulation film, along a side surface and a bottom surface of the first trench and along a side surface and a bottom surface of the second trench, and depositing a second metal gate film on the first metal gate film disposed on the top surface of the first insulation film and on side surfaces and bottom surfaces of the first metal gate film disposed in the first trench and the second trench.

The method further includes performing a first planarization to remove a portion of the first high-k film, the first metal gate film, and the second metal gate film on the first and second regions of the substrate to expose the top surface of the first insulation film, thereby sequentially forming a first high-k film pattern, a first metal gate film pattern and a second metal gate film pattern conformally along the side and bottom surfaces of the first trench and the second trench on the first and second regions of the substrate, respectively. The first metal gate film pattern disposed in the second trench has a thickness greater than a thickness of the first metal gate film pattern disposed in the first trench.

In addition, the method further includes etching an upper portion of the first metal gate film pattern and the second metal gate film pattern disposed in the first trench and the second trench, redepositing a second metal gate film on the first insulation film, the first high-k film pattern, the etched first metal gate film pattern and the etched second metal gate film pattern on the first region and the second region of the substrate. The redeposited second metal gate film pattern is formed of a same material as the etched second metal gate film pattern. The method further includes performing a second planarization process to remove a portion of the redeposited second metal gate film to expose the top surface of the first insulation film, thereby forming a redeposited second metal gate film pattern on the first metal gate film pattern and on the second metal gate film pattern disposed in the first trench and the second trench.

Moreover, the method further includes forming a first blocking layer pattern covering the redeposited second metal gate film pattern disposed in the first trench and a second blocking layer pattern covering the redeposited second metal gate film pattern disposed in the second trench by oxidizing exposed surfaces of the redeposited second metal gate film pattern.

BRIEF DESCRIPTION OF THE DRAWINGS

Exemplary embodiments of the present invention can be understood in more detail from the following detailed description taken in conjunction with the attached drawings in which.

DETAILED DESCRIPTION OF EXEMPLARY EMBODIMENTS

Exemplary embodiments of the present invention will now be described more fully hereinafter with reference to the accompanying drawings, in which exemplary embodiments of the invention are shown. Exemplary embodiments of the invention may, however, be embodied in different forms and should not be construed as being limited to exemplary embodiments set forth herein. The same reference numbers indicate the same components throughout the specification. In the attached figures, the thickness of layers and regions may be exaggerated for clarity.

It will also be understood that when a layer is referred to as being "on" another layer or substrate, it can be directly on the other layer or substrate, or intervening layers may also be present.

The use of the terms "a" and "an" and "the" and similar referents in the context of describing the invention (especially in the context of the following claims) are to be construed to cover both the singular and the plural, unless otherwise indicated herein or clearly contradicted by context.

A method for manufacturing a semiconductor device according to an exemplary embodiment of the present invention is described with reference to FIGS. 1 to 9. FIGS. 1 to 9 are cross-sectional views for explaining methods for manufacturing semiconductor devices according to an exemplary embodiment of the present invention.

Figure 1:
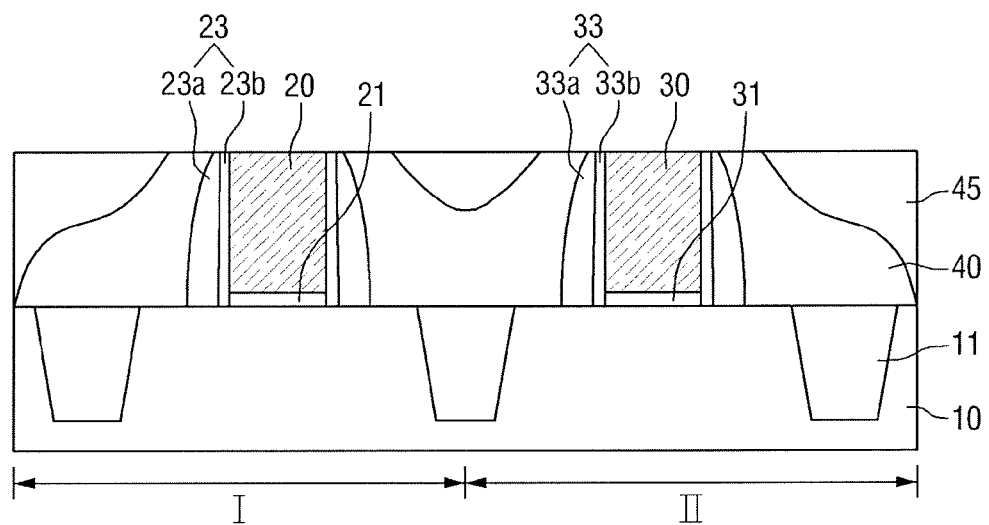
FIGS. 1 to 9 are cross-sectional views for explaining methods for manufacturing semiconductor devices according to an exemplary embodiment of the present invention.

Referring to FIG. 1, a substrate 10 may include, for example, a plurality of isolation regions 11. The substrate 10 may include, for example, a silicon substrate, a gallium arsenic substrate, a silicon germanium substrate, a ceramic substrate, a quartz substrate, or a glass substrate for display, and a SOI (Semiconductor On Insulator) substrate, but exemplary embodiments of the present invention are not limited thereto. The isolation regions 11 may be, for example, oxide films formed by LOCOS (Local Oxidation of Silicon) or STI (Shallow Trench Isolation), but exemplary embodiments of the present invention are not limited thereto.

The substrate 10 may include, for example, a first region (I) and a second region (II). The first region (I) may be, for example, an NFET region where an n-type field effect transistor is formed, and the second region (II) may be, for example, a PFET region where a p-type field effect transistor is formed.

A first insulation film 40 and a stress liner 45 may be formed on the substrate 10.

A first dummy gate film pattern 20 may be formed in the first insulation film 40 on the first region (I) of the substrate 10. The first dummy gate film pattern 20 may include, for example, a polysilicon film pattern, but exemplary embodiments of the present invention are not limited thereto. A first gate insulation film pattern 21 may be formed between the first dummy gate film pattern 20 and the substrate 10. The first gate insulation film pattern 21 may include, for example, an oxide film pattern, but exemplary embodiments of the present invention are not limited thereto. For example, a first spacer 23 may be formed at both sides of the first dummy gate film pattern 20. The first spacer 23 may be, for example, a dual spacer. For example, the first spacer 23 may include a first sub spacer 23a and a second sub spacer 23b. The first spacer 23 may include, for example, at least one of an oxide film spacer and a nitride film spacer, but exemplary embodiments of the present invention are not limited thereto. In addition, the first spacer 23 is not limited to the dual spacer illustrated herein, and the number and thickness of sub spacers included in the first spacer 23 may be varied in various manners according to the desired conditions associated with the design.

A second dummy gate film pattern 30 may be formed in the first insulation film 40 on the second region (II) of the substrate 10. The second dummy gate film pattern 30 may include, for example, a polysilicon film pattern, but exemplary embodiments of the present invention are not limited thereto. A second gate insulation film pattern 31 may be formed between the second dummy gate film pattern 30 and the substrate 10. The second gate insulation film pattern 31 may include, for example, an oxide film pattern, but exemplary embodiments of the present invention are not limited thereto. For example, a second spacer 33 may be formed at both sides of the second dummy gate film pattern 30. The second spacer 33 may be, for example, a dual spacer. For example, the second spacer 33 may include a third sub spacer 33a and a fourth sub spacer 33b. The second spacer 33 may include, for example, at least one of an oxide film spacer and a nitride film spacer, but exemplary embodiments of the present invention are not limited thereto. In addition, the second spacer 33 is not limited to the dual spacer illustrated herein and the number and thickness of sub spacers included in the second spacer 33 may be varied in various manners according to the desired conditions associated with the design.

For example, the first insulation film 40 and the stress liner 45 may fill a space between the first dummy gate film pattern 20 and the second dummy gate film pattern 30, and the stress liner 45 may be formed on the first insulation film 40. For example, the first insulation film 40 may include at least one of undoped silicate glass (USG) and a silicon oxide film and the stress liner 45 may include a silicon nitride film, but exemplary embodiments of the present invention are not limited thereto. An intermediate structure shown in FIG. 1 is formed by planarizing top surfaces of the first insulation film 40 and the stress liner 45 by, for example, chemical mechanical polishing (CMP).

Figure 2:
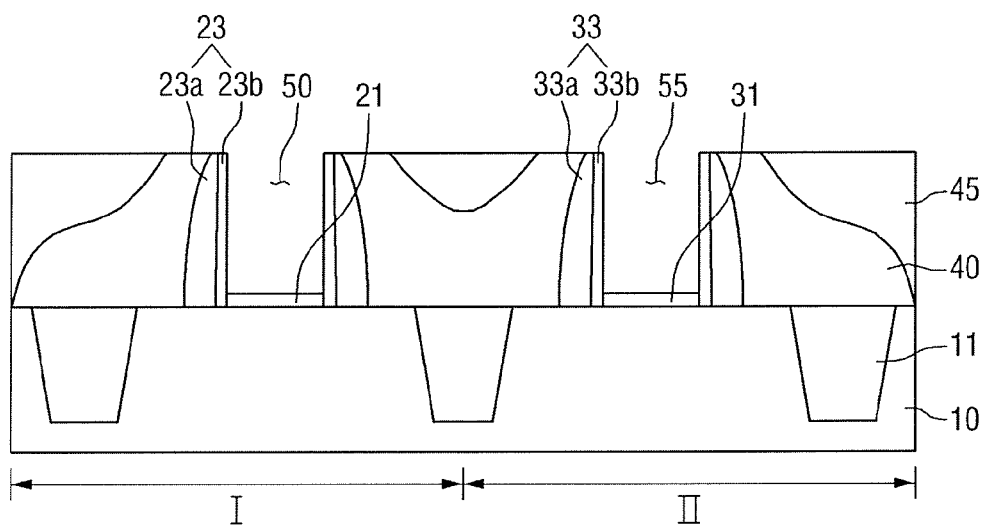

Next, referring to FIG. 2, the first dummy gate film pattern 20 is removed to form a first trench 50, and the second dummy gate film pattern 30 is removed to form a second trench 55.

First, for example, a light stream wet etching process is performed, thereby removing the first and second dummy gate film patterns 20 and 30. However, some of the first and second dummy gate film patterns 20 and 30 may remain. Therefore, the remaining first and second dummy gate film patterns 20 and 30 may be removed by performing, for example, an ashing process using diazene ($H_2N_2$). After the first and second dummy gate film patterns 20 and 30 are removed, first and second trenches 50 and 55 may be formed in the first insulation film 40 positioned on the substrate 10. That is to say, the first trench 50 may be formed on the first region (I) of the substrate 10, and the second trench 55 may be formed on the second region (II) of the substrate 10.

As described above, if the first and second dummy gate film patterns 20 and 30 are removed by performing the two-step process (that is, e.g., light stream wet etching and ashing), over etching may not be performed using the light stream wet etching process to remove the first and second dummy gate film patterns 20 and 30 at once. Therefore, it is possible to prevent a height of a semiconductor device from being reduced due to over etching, but exemplary embodiments of the present invention are not limited thereto. Alternatively, the first and second dummy gate film patterns 20 and 30 may be removed at once by performing, for example, a single-step process.

Figure 3:
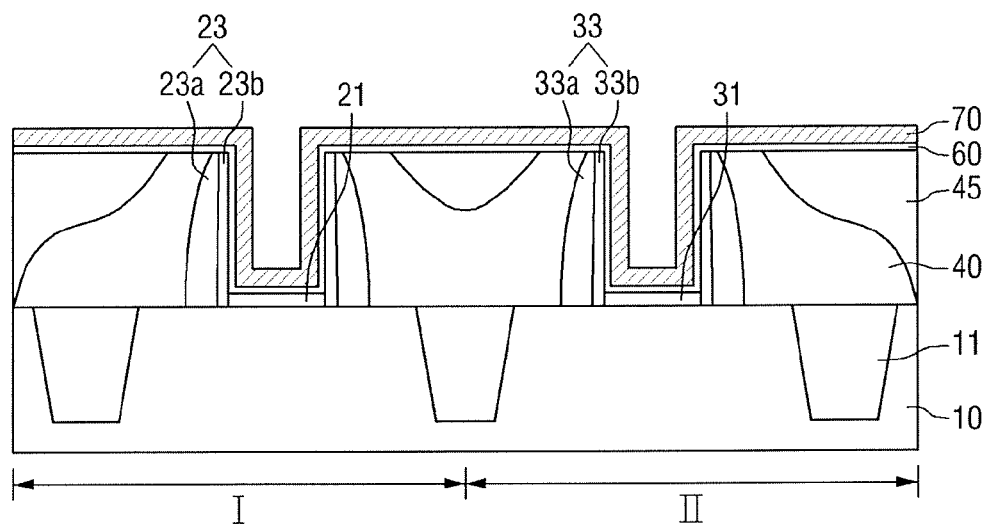

Next, for example, referring to FIG. 3, a first high-k film 60 and a first metal gate film 70 may be sequentially formed (deposited) along a top surface of the first insulation film 40 and side and bottom surfaces of the first and second trenches 50 and 55. For example, the first high-k film 60 and the first metal gate film 70 may be formed conformally along the top surface of the first insulation film 40 and the side and bottom surfaces of the first and second trenches 50 and 55. Then, the first metal gate film 70 may be formed on the first high-k film 60.

The first high-k film 60 may have a higher dielectric constant (high-K) than a silicon oxide film, and may include, for example, hafnium silicate, zirconium silicate, hafnium dioxide, and/or a dioxide, but exemplary embodiments of the present invention are not limited thereto.

The first metal gate film 70 may be, for example, a triple-layered film. The first metal gate film 70 may include, for example, a lower film including titanium nitride (TiN), an intermediate film including tantalum nitride (TaN) and an upper film including TiN, but exemplary embodiments of the present invention not limited thereto. The material forming the first metal gate film 70 may vary according to the necessity.

Figure 4:
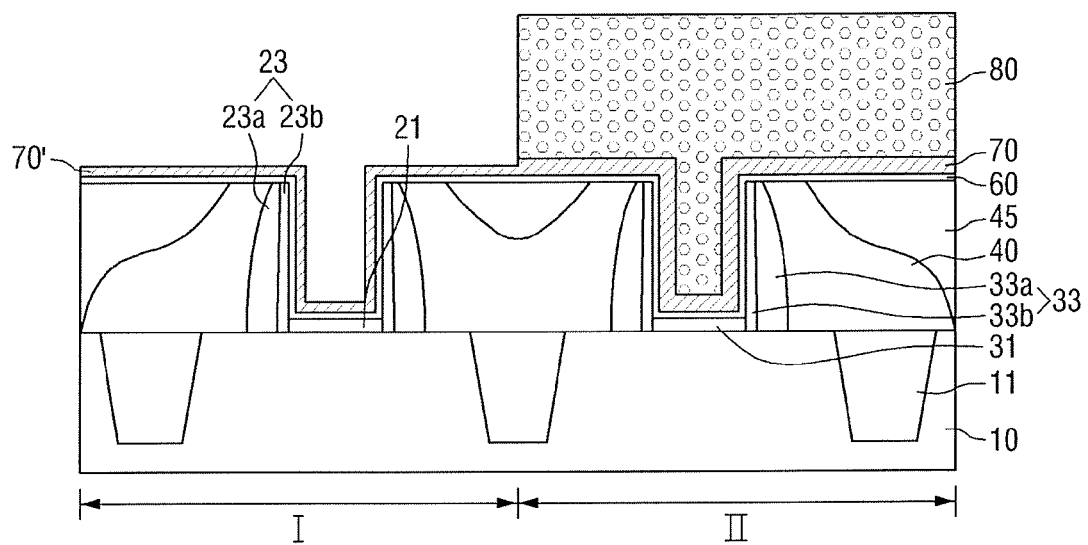

Next, referring to FIG. 4, the upper film including TiN may be removed from the first metal gate film (70 of FIG. 3) formed on the first region (I) of the substrate 10.

For example, a mask film 80 may be formed on the second region (II) of the substrate 10 and then the upper film including TiN may be removed from the first metal gate film (70 of FIG. 3) formed on the first region (I) of the substrate 10 to thereby form a first metal gate film 70' on the first region (I). However, as the mask film 80 covers the first metal gate film 70 formed on the second region (II), the upper film including TiN of the first metal gate film 70 formed on the second region (II) can be prevented from being removed.

As a result, the first metal gate film 70' formed on the first region (I) may include, for example, a lower film including TiN and an intermediate film including TaN, and the first metal gate film 70 formed on the second region (II) may include, for example, a lower film including TiN, an intermediate film including (TaN), and an upper film including TiN.

Figure 5:
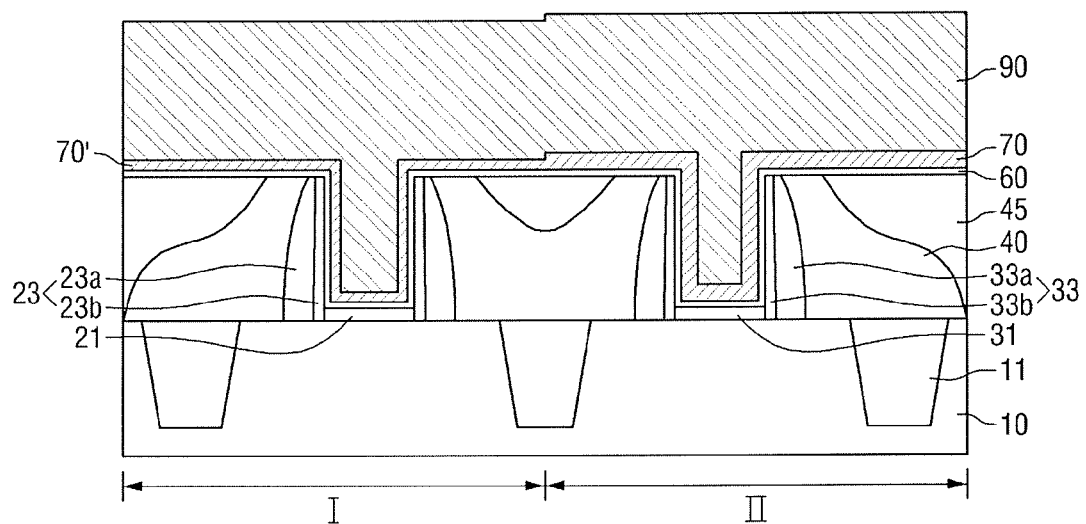

Next, referring to FIG. 5, the mask film 80 may be removed and a second metal gate film 90 may then be formed (deposited) on the first metal gate films 70 and 70'. The second metal gate film 90 may include, for example, a lower film including TiN, an intermediate film including TaN, and an upper film including TiN, but exemplary embodiments of the present invention are not limited thereto.

Figure 6:
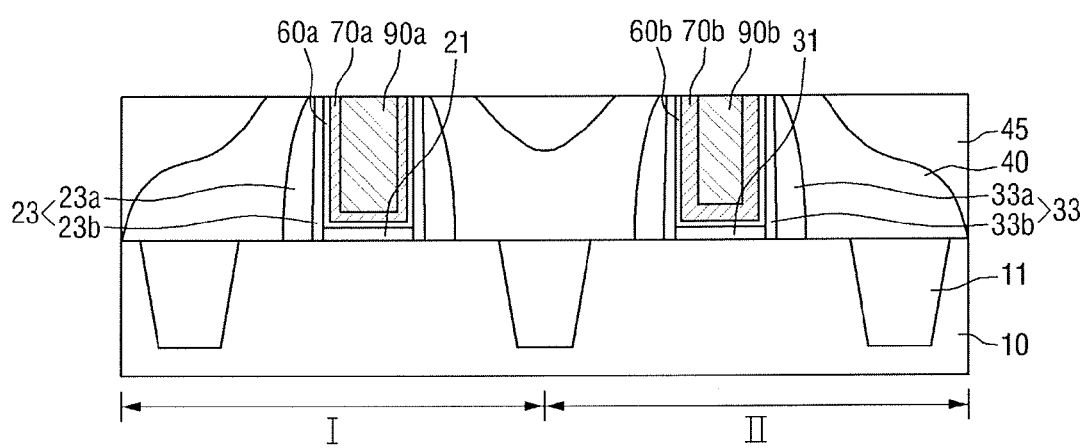

Next, referring to FIG. 6, a first planarization process may be performed to remove a portion of the first high-k film (60 of FIG. 5), a portion of the first metal gate films (70 and 70' of FIG. 5) and a portion of the second metal gate film (90 of FIG. 5) so as to expose at least a portion of the first insulation film 40.

The first planarization process may be, for example, a chemical mechanical polishing (CMP) process. For example, the CMP process may be performed using slurry for planarizing a structure resulting after removing portions of the first high-k film 60, the first metal gate films 70 and 70' and the second metal gate film 90.

As the result of performing the first planarization process, a first-first high-k film pattern 60a may be formed on the first region (I) of the substrate 10 conformally along the side and bottom surfaces of the first trench (50 of FIG. 2). A first-first metal gate film pattern 70a may be formed on the first-first high-k film pattern 60a, for example, conformally along the side and bottom surfaces of the first trench 50. The first-first metal gate film pattern 70a may include, for example, a lower film including TiN and an intermediate film including TaN. A second-first metal gate film pattern 90a may be formed on the first-first metal gate film pattern 70a. The second-first metal gate film pattern 90a may include, for example, a lower film including TiN, an intermediate film including TaN, and an upper film including TiN.

The first-first high-k film pattern 60a and the first-first metal gate film pattern 70a may be formed to have, for example, a U-shaped section along the side and bottom surfaces of the first trench 50. In addition, the side and bottom surfaces of the second-first metal gate film pattern 90a may be surrounded by the first-first metal gate film pattern 70a.

In addition, as the result of performing the first planarization process, a first-second high-k film pattern 60b may be formed on the second region (II) of the substrate 10, for example, conformally along the side and bottom surfaces of the second trench (55 of FIG. 2). A first-second metal gate film pattern 70b may be formed on the first-second high-k film pattern 60b, for example, conformally along the side and bottom surfaces of the second trench 55. The first-second metal gate film pattern 70b may include, for example, a lower film including TiN, an intermediate film including TaN and an upper film including TiN. A second-second metal gate film pattern 90b may be formed on the first-second metal gate film pattern 70b. The second-second metal gate film pattern 90b may include, for example, a lower film including TiN, an intermediate film including TaN, and an upper film including TiN.

The first-second high-k film pattern 60b and the first-second metal gate film pattern 70b may be formed to have, for example, a U-shaped section along the side and bottom surfaces of the second trench 55. In addition, the side and bottom surfaces of the second-second metal gate film pattern 90b may be surrounded by the first-second metal gate film pattern 70b.

Figure 7:
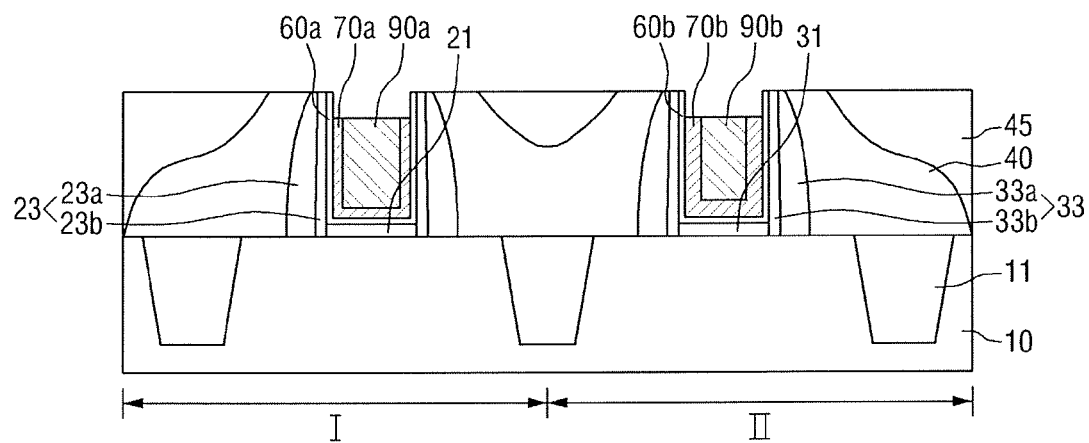

Next, referring to FIG. 7, while removing portions of the second-first and second-second metal gate film patterns 90a and 90b, portions of the side surfaces of the first-first and first-second metal gate film patterns 70a and 70b may be removed so as to reduce heights of the side surfaces of the first-first and first-second metal gate film patterns 70a and 70b.

That is to say, for example, a metal gate pull back process may be performed to etch considerable portions of the second-first and second-second metal gate film patterns 90a and 90b and to etch the side surfaces of the first-first and first-second metal gate film patterns 70a and 70b to a predetermined length. For example, side surfaces of the first-first and first-second metal gate film patterns 70a and 70b may be etched to a predetermined depth. For example, the simultaneous etching of the second-first and second-second metal gate film patterns 90a and 90b and the first-first and first-second metal gate film patterns 70a and 70b may be performed by, for example, a reactive ion etching ((RIE) process or wet etching.

Accordingly, a height ranging from the substrate 10 to a top surface of the first insulation film 40 may be, for example, greater than a height ranging from the substrate 10 to a top surface of each of the first-first and first-second metal gate film patterns 70a and 70b adjacent to the side surfaces of the first and second trenches (50 and 55 of FIG. 2). In addition, a height ranging from the substrate 10 to each of top surfaces of the first and second spacers 23 and 33 adjacent to the first-first and first-second metal gate film patterns 70a and 70b may be, for example, greater than the height ranging from the substrate 10 to a top surface of each of the first-first and first-second metal gate film patterns 70a and 70b adjacent to the side surfaces of the first and second trenches (50 and 55 of FIG. 2).

In addition, the height ranging from the substrate 10 to a top surface of the first insulation film 40 may be, for example, greater than a height ranging from the substrate 10 to each of top surfaces of the second-first and second-second metal gate film patterns 90a and 90b. In addition, the height ranging from the substrate 10 to each of top surfaces of the first and second spacers 23 and 33 adjacent to the first-first and first-second metal gate film patterns 70a and 70b may be, for example, greater than the height ranging from the substrate 10 to a top surface of each of the second-first and second-second metal gate film patterns 90a and 90b.

In addition, each of the first-first and first-second metal gate film patterns 70a and 70b may have, for example, a U-shaped section along the side and bottom surfaces of the first and second trenches 50 and 55. In addition, top surfaces of the first-first and first-second metal gate film patterns 70a and 70b may be separated from top surfaces of the first and second trenches 50 and 55.

Figure 8:
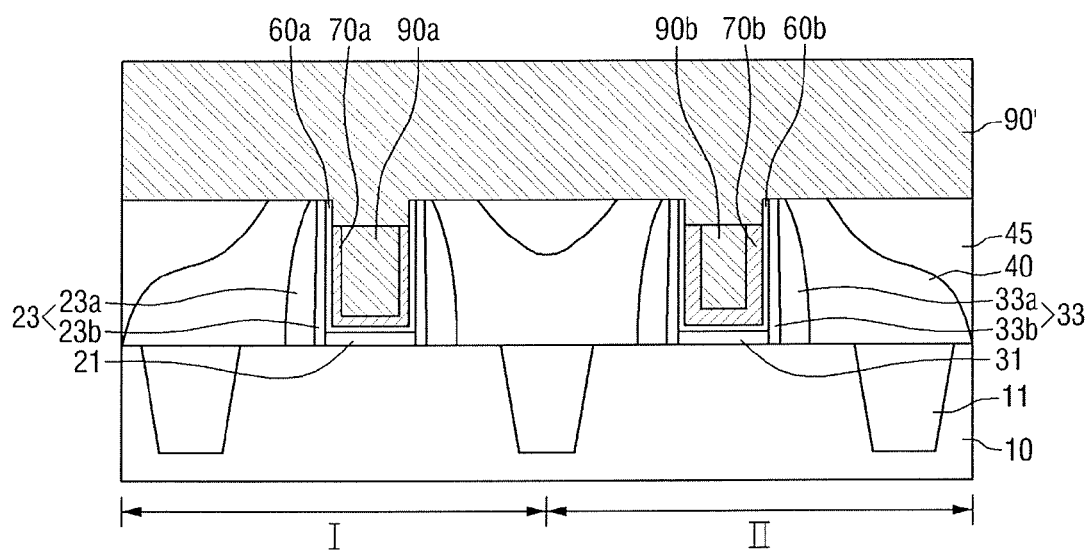

Next, for example, referring to FIG. 8, a second metal gate film 90' may be redeposited on the first insulation film 40, the first-first and first-second metal gate film patterns 70a and 70b and the second-first and second-second metal gate film patterns 90a and 90b. The redeposited second metal gate film 90' may be made of, for example, the same material as the second metal gate film (90 of FIG. 5).

Figure 9:
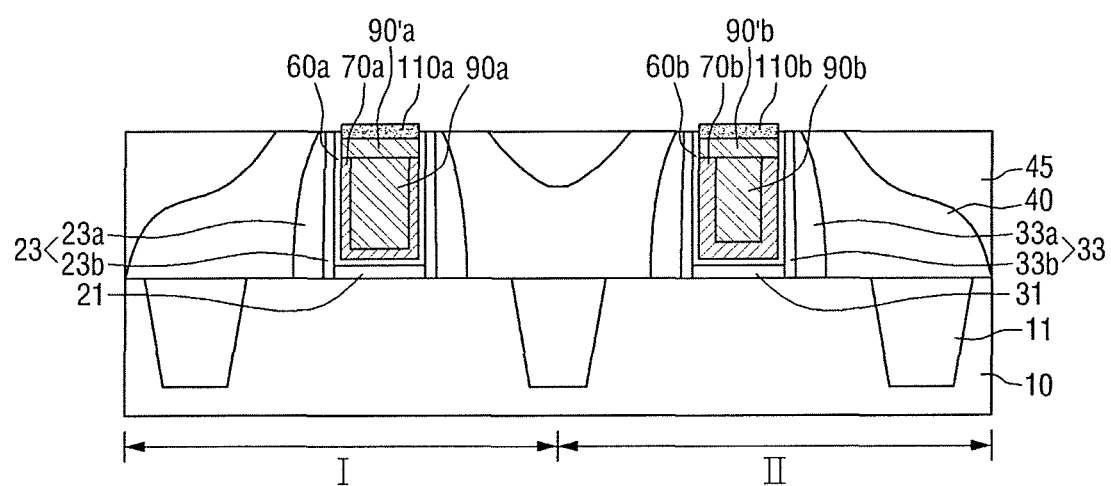

Next, for example, referring to FIG. 9, a second planarization process may be performed to remove a portion of the redeposited second metal gate film 90' so as to expose the top surface of the first insulation film 40, thereby forming a redeposited second-first metal gate film pattern 90'a on the first-first metal gate film pattern 70a and the second-first metal gate film pattern 90a and forming a redeposited second-second metal gate film pattern 90'b on the first-second metal gate film pattern 70b and the second-second metal gate film pattern 90b. In addition, during the second planarization process, exposed surfaces of the redeposited second-first and second-second metal gate film patterns 90'a and 90'b are, for example, oxidized, thereby forming a first blocking layer pattern 110a and second blocking layer pattern 110b on the redeposited second-first and second-second metal gate film patterns 90'a and 90'b, respectively.

The second planarization process may be, for example, a chemical mechanical polishing (CMP) process. For example, the CMP process may be performed using slurry for planarizing a structure resulting after removing the redeposited second metal gate film (90' of FIG. 8). A portion of the redeposited second metal gate film 90' may be removed to form the redeposited second-first metal gate film pattern 90'a on the first region (I) of the substrate 10 and to form the redeposited second-second metal gate film pattern 90'b on the second region (II) of the substrate 10.

For example, the second-first metal gate film pattern 90a and the redeposited second-first metal gate film pattern 90'a connected to each other to have a T-shaped section may be formed on the first-first metal gate film pattern 70a having a U-shaped section. A metal gate formed on the first region (I) of the substrate 10 may include, for example, the first-first metal gate film pattern 70a, the second-first metal gate film pattern 90a and the redeposited second-first metal gate film pattern 90'a and may have, for example, a five-layered structure of titanium nitride (TiN)-tantalum nitride (TaN)-titanium aluminum (TiAl)-titanium nitride (TiN)-titanium/aluminum (Ti/Al), but exemplary embodiments of the present invention are not limited thereto. In addition, as described above, the first-first metal gate film pattern 70a, the second-first metal gate film pattern 90a and the redeposited second-first metal gate film pattern 90'a may be formed by, for example, a replacement metal gate (RMG) process.

Alternatively, for example, the second-second metal gate film pattern 90b and the redeposited second-second metal gate film pattern 90'b connected to each other to have a T-shaped section may be formed on the first-second metal gate film pattern 70b having a U-shaped section. A metal gate formed on the second region (II) of the substrate 10 may include, for example, the first-second metal gate film pattern 70b, the second-second metal gate film pattern 90b and the redeposited second-second metal gate film pattern 90'b and may have, for example, a six-layered structure of TiN—TaN—TiN—TiAl—TiN—Ti/Al, but exemplary embodiments of the present invention are not limited thereto. In addition, as described above, the first-second metal gate film pattern 70b, the second-second metal gate film pattern 90b and the redeposited second-second metal gate film pattern 90'b may be formed by, for example, a replacement metal gate (RMG) process.

During the planarization process, e.g., CMP, an oxidization process may be performed. The exposed surfaces of the redeposited second-first and second-second metal gate film patterns 90'a and 90'b may be, for example, oxidized by the oxidation process performed during the second planarization process. That is to say, the second planarization process may oxidize the exposed surfaces of the redeposited second-first and second-second metal gate film patterns 90'a and 90'b, thereby forming the first and second blocking layer patterns 110a and 110b on the redeposited second-first and second-second metal gate film patterns 90'a and 90'b, respectively. The first and second blocking layer patterns 110a and 110b may be oxide films such as, for example, aluminum oxide films.

As a result, the forming of the redeposited second-first and second-second metal gate film patterns 90'a and 90'b and the forming of the first and second blocking layer patterns 110a and 110b may be, for example, simultaneously performed during the second planarization process.

As the exposed surfaces of the redeposited second-first and second-second metal gate film patterns 90'a and 90'b are oxidized to form the first and second blocking layer patterns 110a and 110b, respectively, the first blocking layer pattern 110a may entirely cover the top surface of the redeposited second-first metal gate film pattern 90'a, and the second blocking layer pattern 110b may entirely cover the top surface of the redeposited second-second metal gate film pattern 90'b. Therefore, the first and second blocking layer patterns 110a and 110b may prevent the redeposited second-first and second-second metal gate film patterns 90'a and 90'b from being exposed to the outside.

As the result of performing the process shown in FIG. 7, portions of the side surfaces of the first-first and first-second metal gate film patterns 70a and 70b are removed so as to reduce heights of the side surfaces the first-first and first-second metal gate film patterns 70a and 70b. Regions resulting from the removing of the portions of the side surfaces of the first-first and first-second metal gate film patterns 70a and 70b may be filled with the redeposited second-first and second-second metal gate film patterns 90'a and 90'b, respectively. Therefore, as the first-first and first-second metal gate film patterns 70a and 70b are covered by the redeposited second-first and second-second metal gate film patterns 90'a and 90'b, respectively, the first-first and first-second metal gate film patterns 70a and 70b are not exposed to the outside. Likewise, as the second-first and second-second metal gate film patterns 90a and 90b are also covered by the redeposited second-first and second-second metal gate film patterns 90'a and 90'b, respectively, the second-first and second-second metal gate film patterns 90a and 90b are not exposed to the outside. In addition, as the first and second blocking layer patterns 110a and 110b are formed on the redeposited second-first and second-second metal gate film patterns 90'a and 90'b, respectively, the first-first and first-second metal gate film patterns 70a and 70b and the second-first and second-second metal gate film patterns 90a and 90b may be protected by the redeposited second-first and second-second metal gate film patterns 90'a and 90'b and the first and second blocking layer patterns 110a and 110b.

Figure 10:
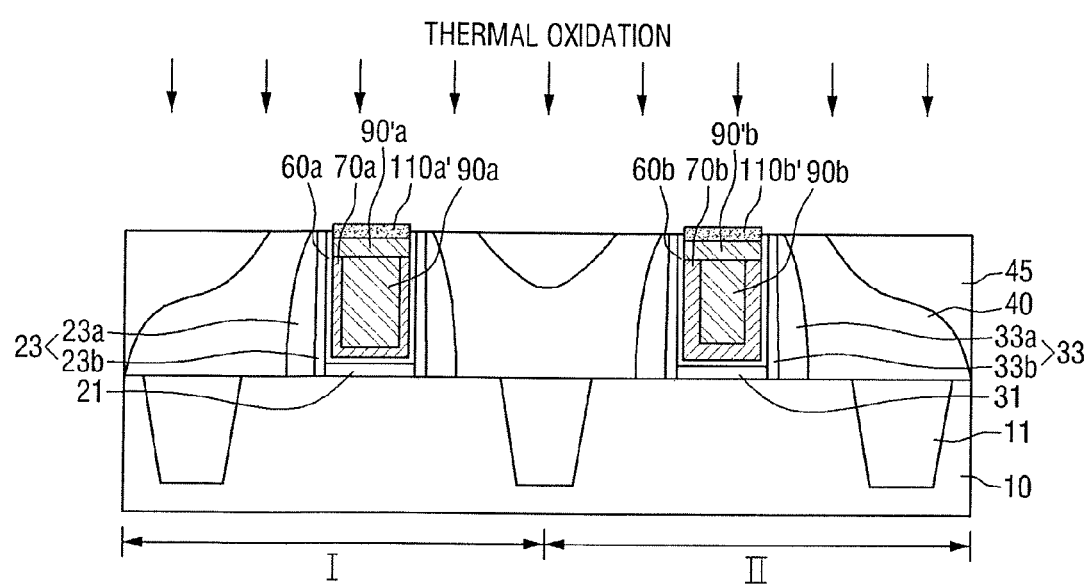
FIG. 10 is a cross-sectional view for explaining methods for manufacturing semiconductor devices according to an exemplary embodiment of the present invention.

A method for manufacturing a semiconductor device according to an exemplary embodiment of the present invention will now be described with reference to FIGS. 1 to 10. However, the following description will focus on differences between the present exemplary embodiment and the method previously described herein for manufacturing a semiconductor device according to FIGS. 1-9. FIG. 10 is a cross-sectional view for explaining methods for manufacturing semiconductor devices according to an exemplary embodiment of the present invention.

For example, in the present exemplary embodiment, the process steps are substantially the same as the process steps shown in FIGS. 1-9. Thus, detailed descriptions of the same process steps thereof will not be given.

In the method for manufacturing semiconductor device according to the present exemplary embodiment, as shown in FIG. 10, a thermal oxidation process may further be performed. That is to say, referring to FIG. 10, exposed surfaces of the redeposited second-first and second-second metal gate film patterns 90'a and 90'b are, for example, thermally oxidized, thereby forming a first blocking layer pattern 110a' and a second blocking layer pattern 110b' which each have a greater thickness in comparison to the thicknesses of each of the first and second blocking layer patterns 110a and 110b described in connection with FIG. 9.

Hereinafter, methods for manufacturing semiconductor devices including self-aligned contacts according to an exemplary embodiment of the present invention will be described with reference to FIGS. 11 to 16. FIGS. 11 to 16 are cross-sectional views for explaining methods for manufacturing semiconductor devices including self-aligned contacts according to an exemplary embodiment of the present invention.

For example, the methods described in connection with FIGS. 11 to 16 may be applied to the semiconductor devices formed in connection with FIG. 9 or 10.

Figure 11:
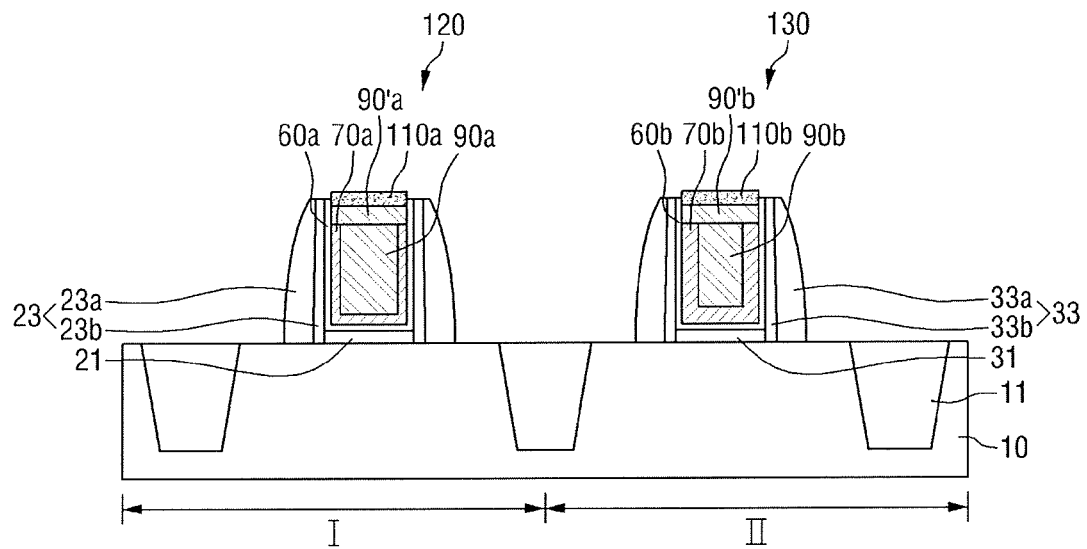
FIGS. 11 to 16 are cross-sectional views for explaining methods for manufacturing semiconductor devices including self-aligned contacts according to an exemplary embodiment of the present invention.

Referring to FIG. 11, a first insulation film 40 and a stress liner 45 provided on a substrate 10 may be removed by, for example, wet etching.

First and second gate structures 120 and 130 may be on formed the first and second regions (I, II) of the substrate 10. The first gate structure 120 may include, for example, a first gate insulation film pattern 21, a first spacer 23, a first-first high-k film pattern 60a, a first-first metal gate film pattern 70a, second-first metal gate film pattern 90a, a redeposited second-first metal gate film pattern 90'a, and a first blocking layer pattern 110a. The second gate structure 130 may include, for example, a second gate insulation film pattern 31, a second spacer 33, a first-second high-k film pattern 60b, a first-second metal gate film pattern 70b, a second-second metal gate film pattern 90b, a redeposited second-second metal gate film pattern 90'b, and a second blocking layer pattern 110b.

Figure 12:
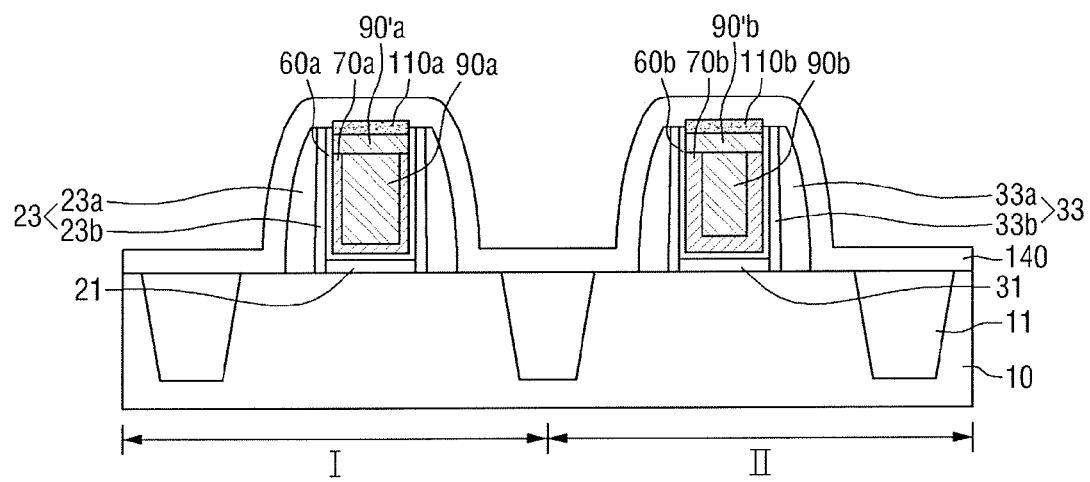

Next, for example, referring to FIG. 12, a second high-k film 140 may be formed on an intermediate structure formed by the process shown in FIG. 11. For example, the second high-k film 140 may be formed on the substrate 10, the first and second spacers 23 and 33, and the first and second blocking layer patterns 110a and 110b. The second high-k film 140 may protect the first and second gate structures 120 and 130. The second high-k film 140 may include, for example, hafnium silicate, zirconium silicate, hafnium dioxide, and/or dioxide. The second high-k film 140 may be deposited by, for example, chemical vapor deposition (CVD) or atomic layer deposition (ALD).

Figure 13:
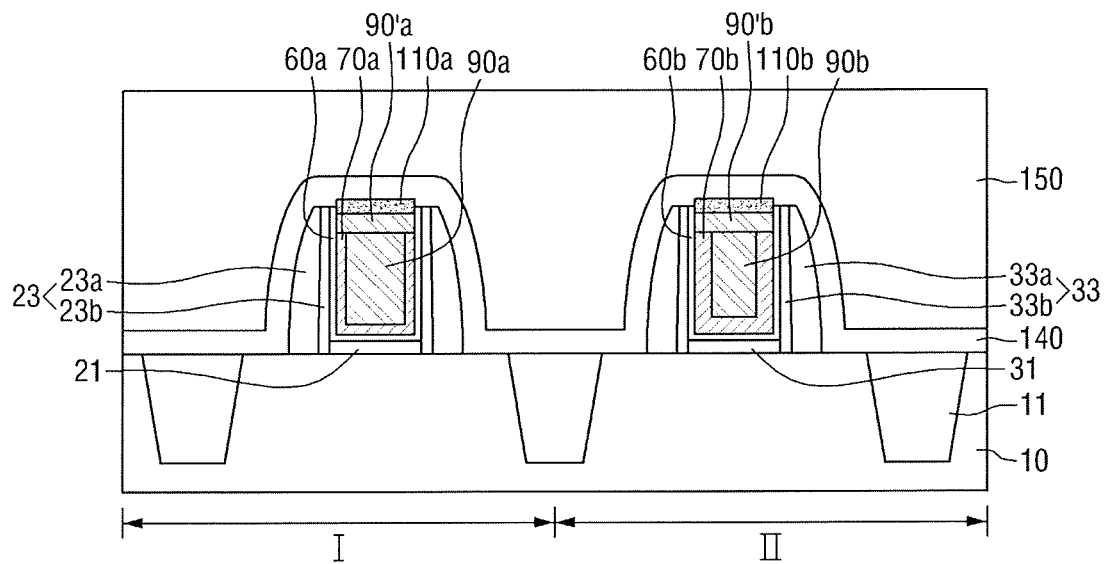

Next, referring to FIG. 13, an interlayer dielectric film 150 including, for example, at least one of a silicon nitride film (SiN) and a silicon oxide film ($SiO_2$) may be formed on the second high-k film 140. The interlayer dielectric film 150 may be deposited by, for example, chemical vapor deposition (CVD) or atomic layer deposition (ALD).

Figure 14:
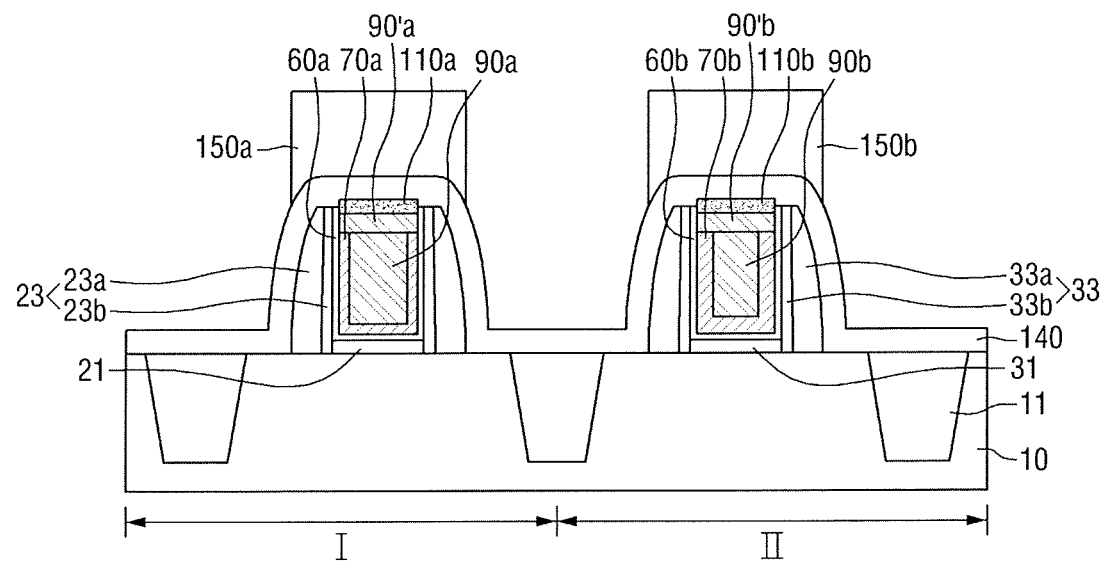

Next, referring to FIG. 14, the interlayer dielectric film (150 of FIG. 13) may be patterned by, for example, wet etching. For example, a mask film may be formed on the first gate structure (120 of FIG. 11) and the second gate structure (130 of FIG. 11) and the interlayer dielectric film 150 may then be patterned. As a result, the interlayer dielectric film 150 not overlapping the first and second gate structures 120 and 130 may be removed. For example, the interlayer dielectric film 150 positioned between the first gate structure 120 and the second gate structure 130 may be removed. As a result, a first interlayer dielectric film pattern 150a and a second interlayer dielectric film pattern 150b may be formed on the first and second gate structures 120 and 130.

Figure 15:
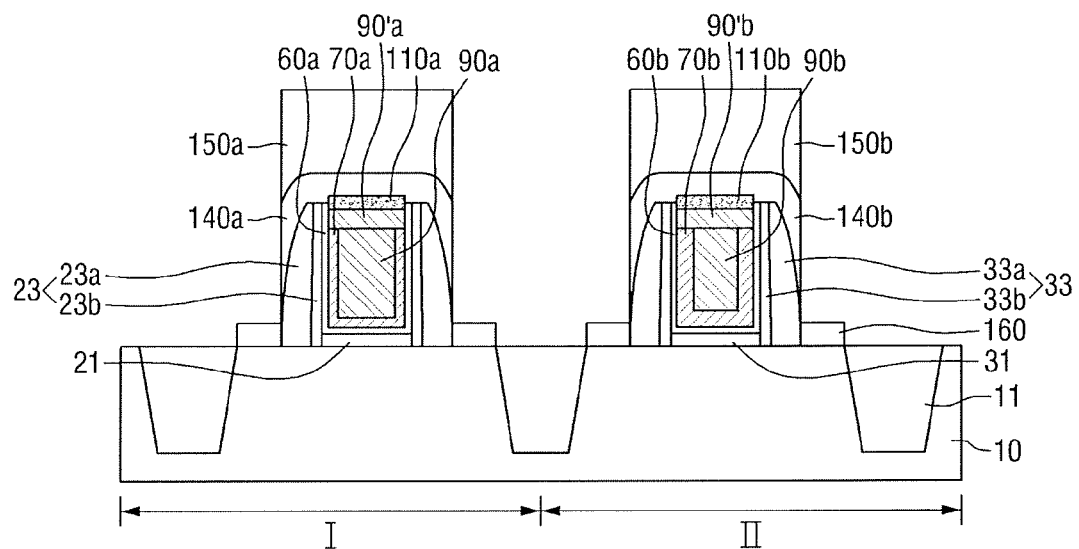

Referring to FIG. 15, the second high-k film (140 of FIG. 14) not covered by the first and second interlayer dielectric film patterns 150a and 150b may be removed. For example, the second high-k film 140 positioned between the first gate structure 120 and the second gate structure 130 may be removed. As a result, a second-first high-k film pattern 140a and a second-second high-k film pattern 140b may be formed on the first and second gate structures 120 and 130.

For example, after a portion of the second high-k film 140 is removed, nickel (Ni) may be deposited on the substrate 10. Then, if the substrate 10 with nickel (Ni) deposited thereon is annealed, nickel (Ni) reacts with the substrate 10, thereby forming a silicide pattern 160. Then, unreacted nickel (Ni) may be removed. The forming of the silicide pattern 160 may reduce sheet resistance.

Figure 16:
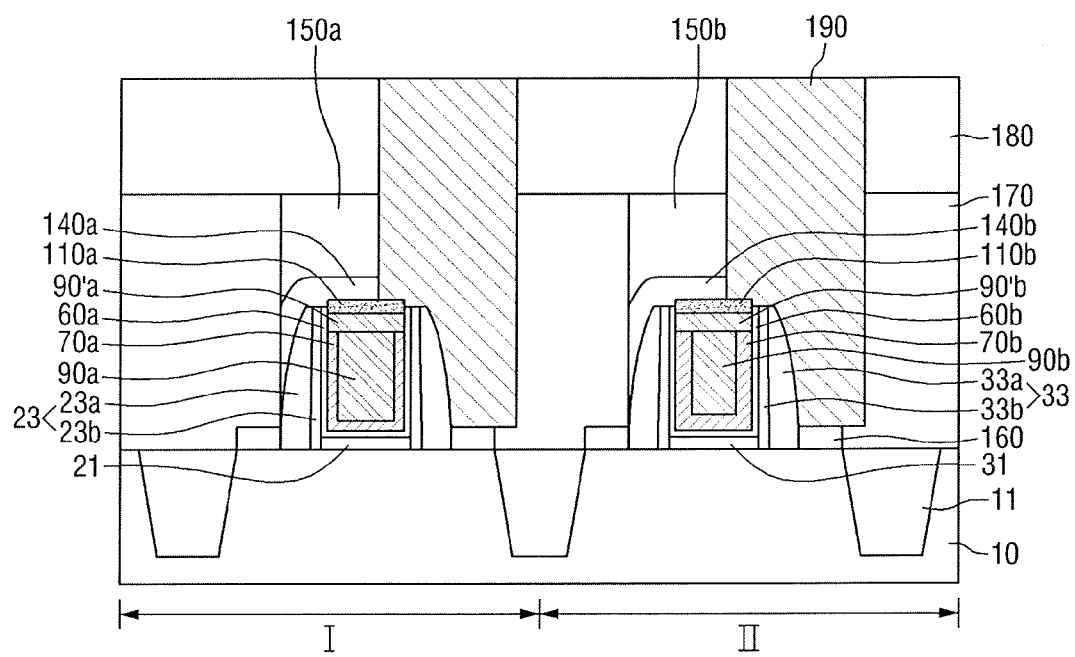

For example, referring to FIG. 16, a second insulation film 170 including a silicon nitride film (SiN) or a silicon oxide film ($SiO_2$) and a third insulation film 180 including tetraethoxysilane (TEOS) or undoped silicate glass (USG) may be formed on the structure shown in FIG. 16. Here, the silicon nitride film (SiN), the silicon oxide film ($SiO_2$) and TEOS may be deposited by, for example, CVD or ALD.

Next, CMP, etching, and metal deposition are performed to form a self-aligned contact (SAC) 190, as shown in FIG. 16. For example, the second insulation film 170 deposited on the silicide pattern 160 and the third insulation film 180 are etched to form a via. The via is filled with, for example, a metal and a planarization is performed by CMP, thereby forming the SAC 190. Here, the SAC 190 may be, for example, tungsten (W), but exemplary embodiments of the present invention are not limited thereto.

Portions of the second-first and second-second high-k films 140a and 140b and the first and second interlayer dielectric film patterns 150a and 150b formed on the redeposited second-first and second-second metal gate film patterns 90'a and 90'b may be removed by, for example, the SAC 190. However, the first and second blocking layer patterns 110a and 110b formed between top surfaces of the redeposited second-first and second-second metal gate film patterns 90'a and 90'b and the SAC 190 may prevent an electrical short from occurring between the redeposited second-first and second-second metal gate film patterns 90'a and 90'b and the SAC 190 (or a wiring connected thereto). This is because the redeposited second-first and second-second metal gate film patterns 90'a and 90'b do not make contact with the SAC 190 due to the first and second blocking layer patterns 110a and 110b.

Figure 17:
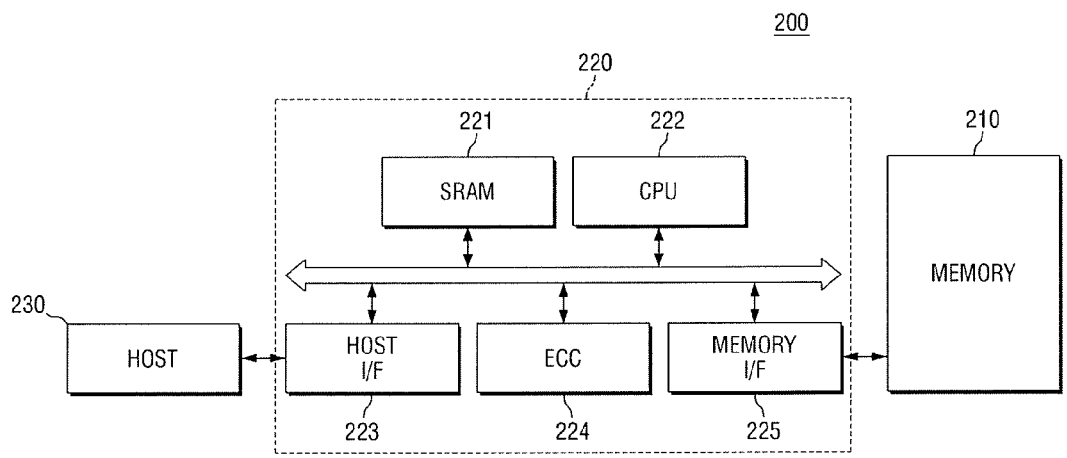
FIG. 17 is a block diagram of a memory card including a semiconductor device according to an exemplary embodiment of the present invention.

FIG. 17 is a block diagram of a memory card including a semiconductor device according to an exemplary embodiment of the present invention.

Referring to FIG. 17, a memory 210 including semiconductor devices manufactured according to an exemplary embodiment of the present invention may be employed to, for example, a memory card 200. The memory card 200 may include, for example, a memory controller 220 that controls data exchange between a host 230 and the memory 210. For example, a static random access memory (SRAM) 221 may be used as an operation memory of a central processing unit (CPU) 222. In addition, for example, a host interface (I/F) 223 may include a protocol to allow the host 230 to access the memory card 200 for data exchange. Also, for example, an error correction code unit (ECC) 224 may detect an error of data read from the memory 210 and may correct the detected error. Moreover, for example, the memory I/F 225 may interface with the memory 210. The CPU 222 may perform the overall control operation associated with data exchange of the memory controller 220.

Figure 18:
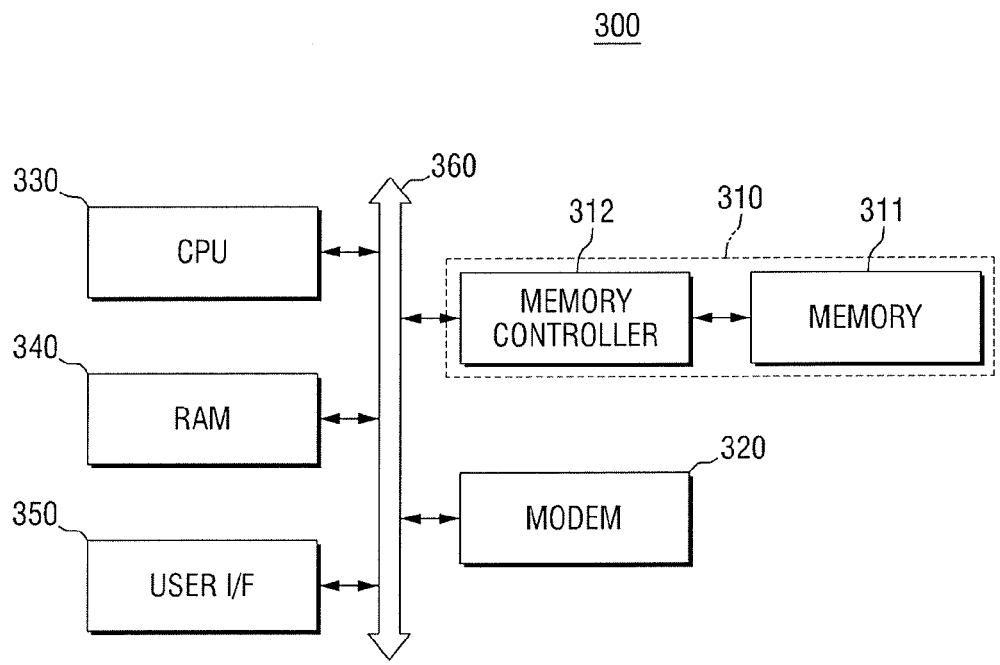
FIG. 18 is a block diagram of an information processing system using a semiconductor device according to an exemplary embodiment of the present invention.

FIG. 18 is a block diagram of an information processing system using a semiconductor device according to an exemplary embodiment of the present invention.

Referring to FIG. 18, an information processing system 300 may include, for example, a memory system 310 including semiconductor devices manufactured according to an exemplary embodiment of the present invention. The information processing system 300 may include, for example, the memory system 310 electrically connected to a system bus 360, a modem 320, a CPU 330, a RAM 340 and a user interface (I/F) 350. The memory system 310 may include, for example, a memory 311 and a memory controller 312 and may have substantially the same configuration as the memory card 200 shown in FIG. 17. The data processed by the CPU 330 or data received from an external device may be stored in the memory system 310. The information processing system 300 may be employed to, for example, a memory card, a solid state diode (SSD), a camera image sensor, and various chip sets. For example, the memory system 310 may be configured to employ SSD. In this case, the information processing system 300 may process large capacity data in a stable and reliable manner.

Figure 19:
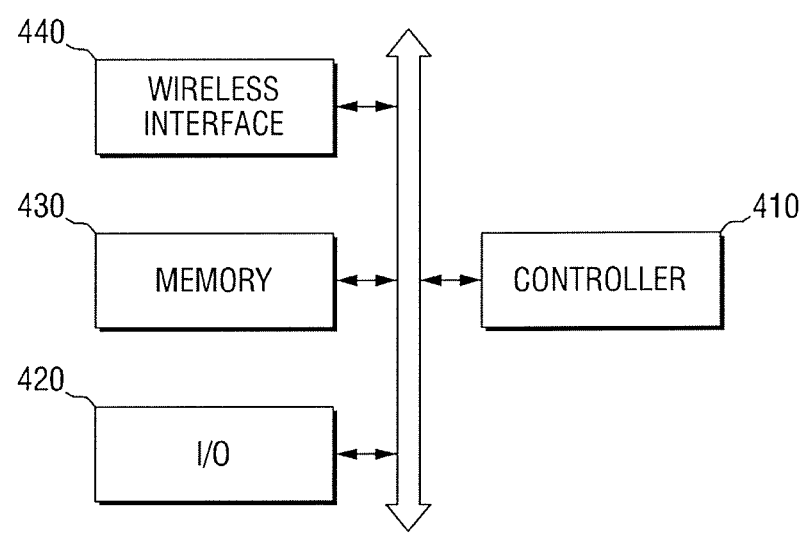
FIG. 19 is a block diagram of an electronic device including a semiconductor device according to an exemplary embodiment of the present invention.

FIG. 19 is a block diagram of an electronic device including a semiconductor device according to an exemplary embodiment of the present invention.

Referring to FIG. 19, an electronic device 400 may include, for example, semiconductor devices manufactured according to an exemplary embodiment of the present invention. The electronic device 400 may be used in, for example, a wireless communication device (for example, PDA, a notebook computer, a portable computer, a web tablet, a cordless phone, and/or a wireless digital music player) or various devices exchanging information in a wireless communication environment.

The electronic device 400 may include, for example, a controller 410, an input/output device (I/O) 420, a memory 430, and a wireless interface 440. Here, the memory 430 may include, for example, semiconductor devices manufactured according to an exemplary embodiment of the present invention. The controller 410 may include, for example, a microprocessor, a digital signal processor or the like. The memory 430 may be used, for example, to store commands (or user data) processed by the controller 410. The wireless interface 440 may be used to exchange data through a wireless data network. The wireless interface 440 may include, for example, an antenna and/or a wireless transceiver. The electronic device 400 may use a third generation communication system protocol, such as, for example, code division multiple access (CDMA), global system for mobile communication (GSM), North American dual mode cellular (NADC), Evolutionary-TDMA Scheduling Protocol (E-TDMA), wideband code division multiple access (WCDMA), or code division multiple access 2000 (CDMA 2000).

Having described exemplary embodiments of the present invention, it is further noted that it is readily apparent to those of ordinary skill in the art that various modifications may be made without departing from the spirit and scope of the invention which is defined by the metes and bounds of the appended claims.

What is claimed is:

1. A method for manufacturing a semiconductor device, comprising:
    forming an insulation film including a trench on a substrate;

depositing a first metal gate film conformally along a top surface of the insulation film and on a side surface and a bottom surface of the trench;

depositing a second metal gate film on the first metal gate film;

forming a first metal gate film pattern and a second metal gate film pattern by performing a first planarization process for removing portions of the first and second metal gate films, together, so as to expose a top surface of the insulation film;

performing a metal gate pull back process to etch upper portions of the first and second metal gate film patterns to a predetermined depth;

depositing a third metal gate film on remaining portions of the first and second metal gate film patterns and the insulation film such that the third metal gate film directly contacts the second metal gate film pattern, the third metal gate film comprising a same material as the second metal gate film pattern;

forming a third metal gate film pattern on the remaining portions of the first and second metal gate film patterns by performing a second planarization process for removing a portion of the third metal gate film so as to expose the top surface of the insulation film; and forming a blocking layer pattern covering an exposed surface of the third metal gate film pattern.

2. The method of claim 1, wherein the forming of the third metal gate film pattern and the forming of the blocking layer pattern are simultaneously performed during the second planarization process.

3. The method of claim 2, wherein the second planarization process includes an oxidization process, and the blocking layer pattern is an oxide film.

4. The method of claim 2, wherein the second planarization process is a chemical mechanical polishing (CMP) process.

5. The method of claim 1, wherein the forming of the first and second metal gate film patterns in the trench comprises forming the first metal gate film pattern to have a U-shaped section along a side surface and a bottom surface of the trench and forming the second metal gate film pattern surrounded by the first metal gate film pattern.

6. The method of claim 5, wherein the forming of the third metal gate film pattern comprises forming the third metal gate film pattern to be connected to the second metal gate film pattern to have a T-shaped section.

7. The method of claim 1, wherein the third metal gate film pattern is disposed between the blocking layer pattern and the first metal gate film pattern.

8. The method of claim 1, wherein after the forming of the insulation film and before the forming of the first and second metal gate film patterns, the method further comprising forming a spacer at opposing sides of the trench, wherein a height ranging from the substrate to a top surface of the spacer is greater than a height ranging from the substrate to a top surface of each of the first and second metal gate film patterns.

9. The method of claim 1, wherein the forming of the first and second metal gate film patterns is performed by a replacement metal gate (RMG) process.

10. The method of claim 1, wherein a height ranging from the substrate to a top surface of the insulation film is greater than a height ranging from the substrate to a top surface of each of the first and second gate metal film patterns.

11. The method of claim 1, wherein the forming of the third metal gate film pattern and the forming of the blocking layer pattern are simultaneously performed during the second planarization process, and wherein the forming of the blocking layer pattern comprises forming the blocking layer pattern covering the exposed surface of the third metal gate film pattern by oxidizing the exposed surface of the third metal gate film pattern.

12. The method of claim 11, wherein the first and second planarization processes are chemical mechanical polishing (CMP) processes.

13. The method of claim 1, wherein the forming of the blocking layer pattern comprises forming the blocking layer pattern covering the exposed surface of the second metal gate film pattern by oxidizing the exposed surface of the third metal gate film pattern by performing a thermal oxidation.

14. A method for manufacturing a semiconductor device, comprising:

forming a first insulation film on a substrate, wherein the substrate includes a first region and a second region;

forming a first dummy gate film pattern in the first insulation film in the first region and a second dummy gate film pattern in the first insulation film in the second region;

removing the first dummy gate film pattern from the first region and the second dummy gate film pattern from the second region to thereby form a first trench in the first insulation film on the first region of the substrate and a second trench in the first insulation film on the second region of the substrate;

sequentially depositing a first high dielectric constant (high k) film and a first metal gate film along a top surface of the first insulation film, along a side surface and a bottom surface of the first trench and along a side surface and a bottom surface of the second trench;

depositing a second metal gate film on the first metal gate film disposed on the top surface of the first insulation film and on side surfaces and bottom surfaces of the first metal gate film disposed in the first trench and the second trench;

performing a first planarization to remove a portion of the first high-k film, the first metal gate film, and the second metal gate film on the first and second regions of the substrate to expose the top surface of the first insulation film, thereby sequentially forming a first high-k film pattern, a first metal gate film pattern and a second metal gate film pattern conformally along the side and bottom surfaces of the first trench and the second trench on the first and second regions of the substrate, respectively, wherein the first metal gate film pattern disposed in the second trench has a thickness greater than a thickness of the first metal gate film pattern disposed in the first trench;

etching an upper portion of the first metal gate film pattern and the second metal gate film pattern disposed in the first trench and the second trench;

depositing a third metal gate film on the first insulation film, the first high-k film pattern, the etched first metal gate film pattern and the etched second metal gate film pattern on the first region and the second region of the substrate, wherein the third metal gate film pattern is formed of a same material as the etched second metal gate film pattern and the third metal gate film is in direct contact with the second metal gate film pattern;

performing a second planarization process to remove a portion of the third metal gate film to expose the top surface of the first insulation film, thereby forming a third metal gate film pattern on the first metal gate film pattern and on the second metal gate film pattern disposed in the first trench and the second trench; and forming a first blocking layer pattern covering the third metal gate film pattern disposed in the first trench and a second blocking layer pattern covering the third metal gate film pattern disposed in the second trench by oxidizing exposed surfaces of the third metal gate film pattern.

15. The method of claim 14, wherein the forming of the third metal gate film pattern disposed in the first trench and the second trench, and the forming of the first blocking layer pattern and the second blocking layer pattern are simultaneously performed during the second planarization process.

16. The method of claim 14, wherein the first metal gate film pattern disposed on the first region of the substrate includes a first lower film including titanium nitride (TiN), and a first intermediate film including tantalum nitride (TaN), wherein the first metal gate film pattern disposed on the second region of the substrate includes a second lower film including TiN, a second intermediate film including TaN and an upper film including TiN, and wherein the second metal gate film pattern disposed on the first metal gate film pattern in the first and second regions of the substrate includes a third lower film including TiN, a third intermediate film including TaN and a third upper film including TiN and wherein the first high-k film pattern comprises one of hafnium silicate, zirconium silicate, or hafnium dioxide.

17. The method of claim 14, wherein top surfaces of the first metal gate film pattern and the second gate film pattern disposed in the first trench and the second trench are covered substantially entirely by the third metal gate film pattern, wherein the first blocking layer pattern covers substantially entirely a top surface of the third metal gate film pattern disposed in the first trench and wherein the second blocking layer pattern covers substantially entirely a top surface of the third metal gate film pattern disposed in the second trench.

* * * * *